(12) United States Patent
Baumstark et al.

(10) Patent No.: US 10,895,067 B2
(45) Date of Patent: Jan. 19, 2021

(54) OPERATOR CONTROL DEVICE FOR A WATER-CONDUCTING SANITARY FITTING

(71) Applicant: Hansgrohe SE, Schiltach (DE)

(72) Inventors: Lars Baumstark, Freiburg (DE); Aline Gebert, Aichhalden (DE)

(73) Assignee: Hansgrohe SE, Schiltach (DE)

( * ) Notice: Subject to any disclaimer, the term of this patent is extended or adjusted under 35 U.S.C. 154(b) by 0 days.

(21) Appl. No.: 16/812,198

(22) Filed: Mar. 6, 2020

(65) Prior Publication Data
US 2020/0284007 A1   Sep. 10, 2020

(30) Foreign Application Priority Data

Mar. 8, 2019 (DE) .................. 10 2019 203 170

(51) Int. Cl.
*G08C 17/02* (2006.01)
*F16K 11/24* (2006.01)
(Continued)

(52) U.S. Cl.
CPC .............. *E03C 1/055* (2013.01); *G01D 5/145* (2013.01); *G08C 17/02* (2013.01)

(58) Field of Classification Search
CPC ...................................................... F16K 31/08
See application file for complete search history.

(56) References Cited

U.S. PATENT DOCUMENTS

| 8,424,568 B2 | 4/2013 | Lang et al. |
| 8,469,054 B2 | 6/2013 | Lang et al. |

(Continued)

FOREIGN PATENT DOCUMENTS

| EP | 2250321 B1 | 5/2013 |
| EP | 3048084 A1 | 7/2016 |

(Continued)

OTHER PUBLICATIONS

European Search Report dated Jul. 13, 2020 for European Patent No. EP 20161134.0, 7 pages.

(Continued)

*Primary Examiner* — Joseph H Feild
*Assistant Examiner* — Pameshanand Mahase
(74) *Attorney, Agent, or Firm* — Faegre Drinker Biddle & Reath LLP

(57) ABSTRACT

An operator control device for a water conducting sanitary fitting including a basic holder with an operating toggle disposed thereon, which toggle has a rotating operating part and a fixed operating part which are rotatable in relation to each other, wherein the rotating operating part is rotatable about a rotation axis on the basic holder. The operating toggle can be pushed in towards the basic holder along the rotation axis. At least one pusher magnet is disposed in the basic holder, and at least one magnetic field sensor is disposed in the operating toggle. An evaluation device for the magnetic field sensor is provided, in order to detect whether the sensor approaches the pusher magnet during pushing-in. At least one magnetic element is disposed in the rotating operating part. The pusher magnet is rotatably mounted for rotation about the rotation axis of the rotating operating part of the operating toggle, wherein the pusher magnet is operable for interaction with the magnetic element such that the pusher magnet co-rotates upon rotation of the magnetic element together with the rotating operating part of the operating toggle.

24 Claims, 5 Drawing Sheets

(51) Int. Cl.
*F16K 31/02* (2006.01)
*F16K 31/06* (2006.01)
*E03C 1/05* (2006.01)
*G01D 5/14* (2006.01)

(56) References Cited

U.S. PATENT DOCUMENTS

| | | |
|---|---|---|
| 8,534,318 B2 | 9/2013 | Kanemaru et al. |
| 2008/0259056 A1 | 10/2008 | Freier et al. |
| 2010/0013466 A1* | 1/2010 | Steinich .................. G01B 7/30 |
| | | 324/207.25 |
| 2010/0327198 A1 | 12/2010 | Lang et al. |
| 2011/0011473 A1 | 1/2011 | Lang et al. |
| 2013/0113465 A1 | 5/2013 | Padilla |
| 2016/0109028 A1* | 4/2016 | Querejeta Andueza ..................... |
| | | F16K 3/0254 |
| | | 137/78.1 |
| 2016/0189896 A1 | 6/2016 | Lee et al. |
| 2016/0214041 A1 | 7/2016 | Miller et al. |
| 2018/0106023 A1 | 4/2018 | Brunner et al. |
| 2018/0126147 A1* | 5/2018 | Hakim .................. A61B 5/4836 |
| 2019/0052163 A1* | 2/2019 | Kornman .................. H02K 1/32 |

FOREIGN PATENT DOCUMENTS

| | | |
|---|---|---|
| EP | 3048627 A1 | 7/2016 |
| EP | 2267232 B1 | 8/2017 |
| EP | 2267232 B2 | 8/2017 |
| EP | 3265617 B1 | 2/2020 |
| JP | 2010-186572 A | 8/2010 |
| JP | 2011-043335 A | 3/2011 |
| WO | 2009103596 A1 | 8/2009 |

OTHER PUBLICATIONS

Office Action issued by the German Patent and Trademark Office, dated Jul. 30, 2020 for German Patent Application No. 10 2019 203 170.6.

* cited by examiner

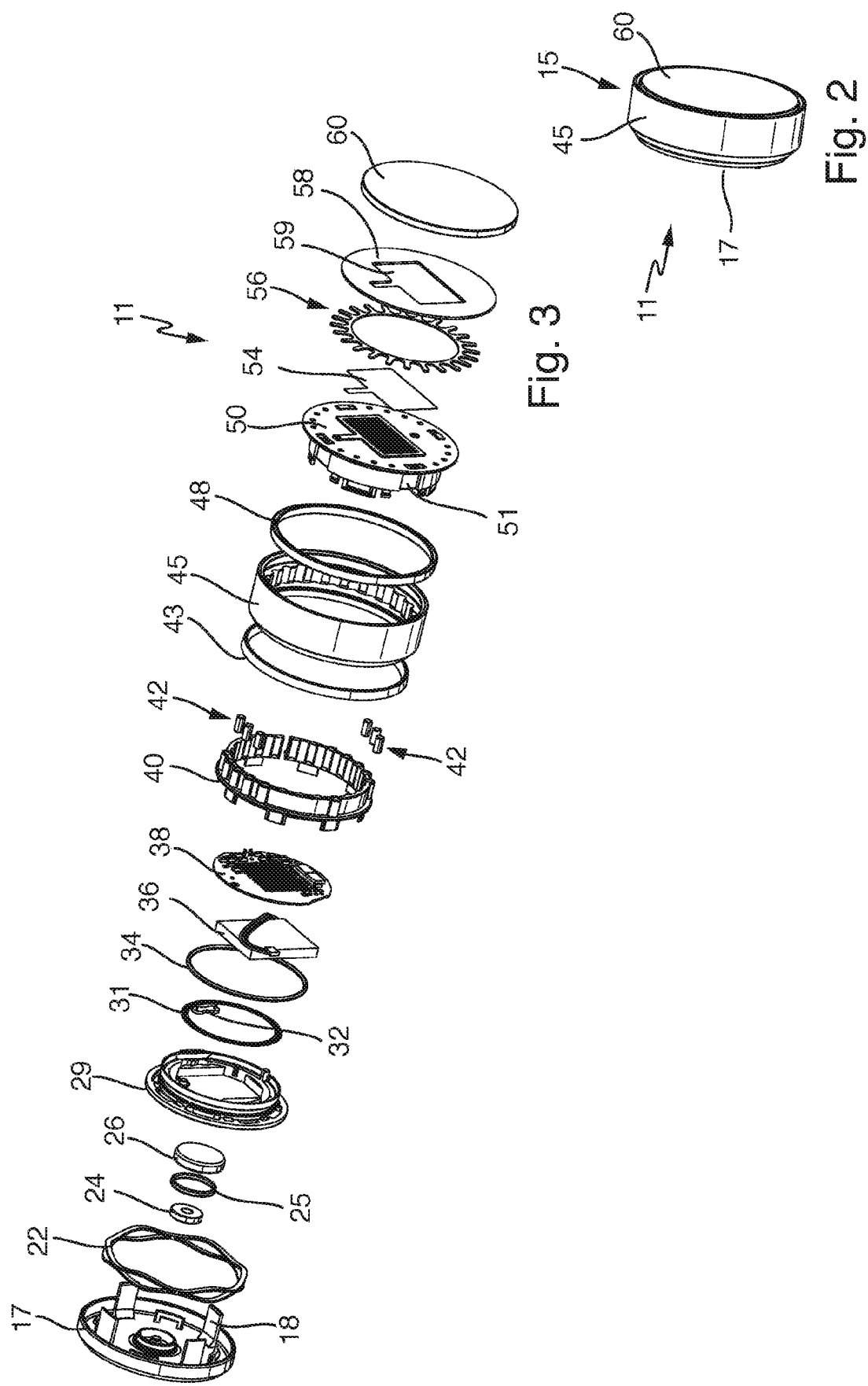

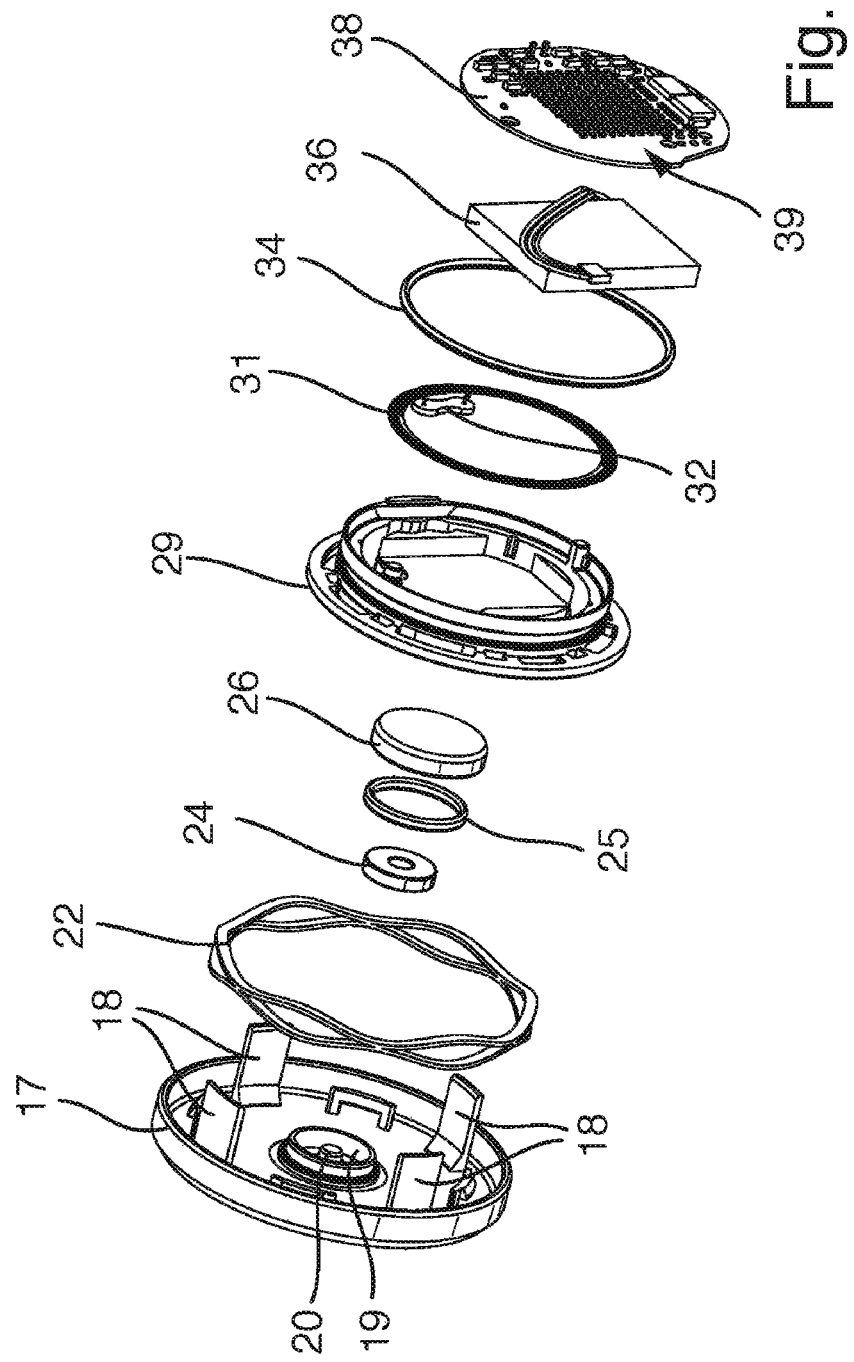

OPERATOR CONTROL DEVICE FOR A WATER-CONDUCTING SANITARY FITTING

CROSS-REFERENCE TO RELATED APPLICATION

This application claims priority to German Patent Application No. DE 10 2019 203 170.6, filed on Mar. 8, 2019, the disclosure of which is expressly incorporated herein by reference.

BACKGROUND AND SUMMARY OF THE DISCLOSURE

The invention relates to an operator control device for a water-conducting sanitary fitting, the operator control device comprising a basic holder fastenable or fastened to be fixed in location, and an operating toggle disposed on the basic holder. The operating toggle has at least two parts, namely at least one rotating operating part and at least one fixed operating part, which are rotatable in relation to each other.

An operator control device of the type mentioned at the beginning is disclosed in the patents EP 2 250 321 B1 and EP 2 267 232 B1.

It is an object of the invention to provide an operator control device of the type mentioned at the beginning which improves and very conveniently permits operation of a water-conducting sanitary fitting, wherein in particular the operating toggle thereof offers significant application advantages.

The illustrative embodiment of the invention achieves this and other objects by providing an operator control device including a basic holder fastenable or fastened to be fixed in location and an operating toggle arranged on the basic holder. The operating toggle has at least two parts, namely at least one rotating operating part and at least one fixed operating part, wherein rotating operating part and fixed operating part are rotatable in relation to each other.

At least the rotating operating part of the operating toggle on the basic holder is rotatable about a rotation axis, and can therefore rotate. Advantageously it can be rotated about a rotational axis perpendicular to a wall or sub-base to which it is fixed. At least one part of the operating toggle can be pushed in towards the basic holder to a pushed-in position from a normal position along the rotational axis against a spring force of a spring. This can be defined accurately by a stop as a push-in stop. The spring urges the operating toggle with the spring force from the pushed-in position to the normal position, and can thus urge it back. Thus, after being pushed in, it automatically moves back again or out again. At least one pusher magnet, which is advantageously formed as a permanent magnet, is disposed in the basic holder. At least one magnetic field sensor, advantageously a Hall sensor, is disposed in the part of the operating toggle that can be pushed in.

An evaluation device for the magnetic field sensor is provided in the operator control device or in the operating toggle, which evaluation device is configured to be able to detect whether the magnetic field sensor approaches the pusher magnet during the pushing-in of the part of the operating toggle that can be pushed in or moves away therefrom. Thus, the pushing-in of the part that can be pushed in can be detected or the position thereof in the direction of the basic holder. Furthermore, at least one magnetic element, advantageously a plurality thereof, is disposed in the rotating operating part of the operating toggle. It can be used to detect the rotation of the operating part or of the operating toggle, advantageously once more via a magnetic field sensor.

According to an illustrative embodiment of the invention, the pusher magnet is rotatably mounted for rotation about a distinct axis which corresponds to the rotational axis of the rotating operating part or is located thereon. Thus, the pusher magnet is located centrally in relation to the rotating operating part. The pusher magnet is intended to interact with the magnetic element in such a way that the pusher magnet co-rotates upon rotation of the magnetic element together with the rotating operating part of the operating toggle. Thus, the pusher magnet is intended always to be in the same position relative to the at least one magnetic element or to all the magnetic elements which can be rotated. As a result, the magnetic field formed between them is always the same, irrespective of the rotational position of the operating toggle or of the rotating operating part. This makes it possible for the aforementioned magnetic field sensor to detect an approach to the pusher magnet particularly accurately and without faults, and independently to distinguish it from a rotation or primarily also from a rotation of the rotating operating part between the two positions.

In an illustrative development of the invention, the pusher magnet has a rotational-symmetric design. Advantageously, it is designed as a disc or a circular ring. The rotation axis of the rotating operating part can extend through a center point and rotation-symmetry point of the pusher magnet, wherein the two rotation axes preferably coincide or are the same.

In an illustrative advantageous development of the invention, the pusher magnet is movable in the direction along the rotation axis, thus towards the basic holder, at a maximum of 1 mm or 25% of the movement path of the operating toggle during pushing towards the basic holder. However, this play should advantageously be as low as possible, so that although easy rotation of the pusher magnet is permitted, no noticeable movement of the pusher magnet towards the magnetic field sensor is made possible. Particularly advantageously, the pusher magnet is not movable at all in the direction along the rotation axis. Rotatability of the pusher magnet can be improved by appropriate materials, advantageously coatings, in particular within a holder for the pusher magnet on or in the basic holder.

In an illustrative refinement of the invention, the pusher magnet formed as a permanent magnet is diametrically magnetized, thus its north-south direction can extend in a direction perpendicular to the rotation axis. In the case of a pusher magnet in ring form, half of the ring can form a north pole, and the other half of the ring then forms a south pole.

In a further illustrative refinement of the invention, the at least one magnetic element in the rotating operating part is a permanent magnet, in particular with magnetization with north-south direction in a direction parallel to the rotation axis of the rotating operating part. Preferably, a plurality of magnetic elements can be arranged as permanent magnets in the operating toggle. They can be formed identically, which means that the expenditure can be reduced. Possibly, the magnetic elements can be disposed differently, for example some, in particular half, with reversed magnetization to the other half. This division into halves can be made in accordance with a respective semicircle of the rotating operating part, for example in order that the correspondingly magnetized pusher magnet can be aligned accurately and correspondingly thereto. It can then also maintain this alignment, irrespective of pushing in of the operating toggle.

In a still further illustrative refinement of the invention, the at least one magnetic element in the rotating operating part is disposed in the vicinity of an outer edge of the rotating operating part. Advantageously, all the magnetic elements are arranged thus in the rotating operating part, advantageously along a circle, with the rotation axis passing through the center point thereof. The magnetic elements can be at a distance from one another, wherein this does not always have to be the same between them.

In a still further illustrative refinement of the invention, the spring against which the operating toggle can be pushed in is ring-shaped. A center point can lie on the rotation axis or coincide therewith. The spring is located advantageously relatively far out in the vicinity of an outer edge of the operating toggle, which means that its spring action can be more uniform. The spring is advantageously formed as an ondular spring; it can have two mirror-symmetrically undulating rings made of spring-elastic material with a mirror plane perpendicular to the rotation axis. Alternatively, a plurality of smaller springs could advantageously be disposed in a circle.

Preferably, the pusher magnet is disposed in a recess corresponding approximately to its shape, therefore, for example, is in the shape of a circular ring. Additionally or alternatively, it can be disposed sitting on a projection of the basic holder, wherein this projection is preferably designed as a type of rotary bearing. A covering, advantageously of the type of a lid or the like, can hold the pusher magnet in the recess. It can in particular be designed as a round lid, possibly with a projecting and over-engaging edge. Said lid can cover the pusher magnet in a water-tight manner towards the outside; it should of course maintain its easy rotatability.

Advantageously, the magnetic field sensor can be disposed in the fixed operating part and non-rotatably retained, particularly advantageously by the basic holder. The magnetic field sensor is therefore intended not to have to co-rotate or advantageously not be able to co-rotate, since the intention is that a relative rotation in relation to the rotatable magnetic elements can be detected, it should be able to be moved towards the pusher magnet only with the part of the operating toggle that can be pushed in.

In an illustrative refinement of the invention, the operating toggle is composed of two parts, with the fixed operating part as an interior part which is non-rotatably retained by the basic holder, or is prevented from rotating by the latter, advantageously by a form fit such as, for example, projecting retaining tongues or the like. Provided around the fixed operating part is the rotating operating part which can be rotated relative thereto as an actuation ring, the outer edge of which can form an outer edge of the operating toggle, which can therefore be gripped by an operator for rotation. The at least one magnetic element is retained in or on the rotating operating part, since it is definitely intended to be able to rotate.

In a further illustrative refinement of the invention, the operating toggle includes only the rotatable rotating operating part and the fixed operating part, that is only two parts. Of course, these in turn have a plurality of components and functional units. Advantageously, the entire operating toggle can be pushed in onto the basic holder, therefore the rotating operating part and fixed operating part together. This is one possible simple configuration, which of course can then also more easily be watertight. Alternatively, however, it is also possible that only part of the operating toggle can be pushed in, for example the fixed operating part. This is particularly advantageous when the magnetic field sensor is disposed therein.

The operating toggle can advantageously form a structural unit with the basic holder, that is to say be disposed or fixed with the latter or by means of the latter in a fixed position, for example on a wall. To this end, a form-fitting fixing means or the like can be provided on the rear side of the basic holder, for example in order to be able to suspend it in a wall holder.

In a still further illustrative refinement of the invention, the fixed operating part has a display, which can preferably be formed as an illuminated display. This can have LEDs, which can be disposed in a known manner and can light up. They can also be backlit displays, for example using TFT technology.

The magnetic field sensor can be formed as a structural unit together with further magnetic field sensors in order to be able to detect a rotation of the rotating operating part relative to the basic holder. It could advantageously be formed as a 3-D magnetic field sensor or as a 3-D Hall sensor, as are known per se from the prior art. They can measure changes in a magnetic field in various directions or with various magnetization directions. Such a structural unit can have a common connector device.

Preferably, a signal evaluation for the magnetic field sensor is provided in the operating toggle, which can have an integrated circuit, advantageously a controller or microcontroller. This signal evaluation can be designed in a conventional way, in particular precisely for 3-D magnetic field sensors or 3-D Hall sensors. The signal evaluation itself can have a transmission device for wireless sending or transmitting of the data on the detected rotated and/or pushed position of the operating toggle relative to the basic holder to a control unit for controlling the water-conducting sanitary fitting. Alternatively, this transmission device can be provided separately in the operator control device or in the operating toggle. Various generally known and suitable standards can be used in the wireless sending or transmission of the data.

The operating toggle advantageously has a distinct energy supply, preferably a battery pack. Such a battery pack is preferably disposed in the fixed operating part. It can be charged when the operating toggle is taken off, preferably inductively, as is known. To this end, a corresponding coil can be provided in the operating toggle. Then, no electrical contacts are needed, which could corrode in the moist surroundings of the operator control device in a shower or the like and could thus cause problems.

Additional features and advantages of the present invention will become apparent to those skilled in the art upon consideration of the following detailed description of the illustrative embodiments best exemplifying the best mode of carrying out the invention as presently perceived.

BRIEF DESCRIPTION OF THE DRAWINGS

Advantageous embodiments of the invention are illustrated in the drawings. These and further embodiments of the invention are described in greater detail below. In the drawings:

FIG. 2 shows an oblique view from the side on the operator control device according to the invention with a fixable basic holder on which an operating toggle is disposed, FIG. 3 shows basic holder and operating toggle of the operator control device from FIG. 2 in an exploded illustration, FIGS. 4*a* and 4*b* show the exploded illustration of FIG. 3 in an enlargement, divided into two illustrations.

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

Figure 1:
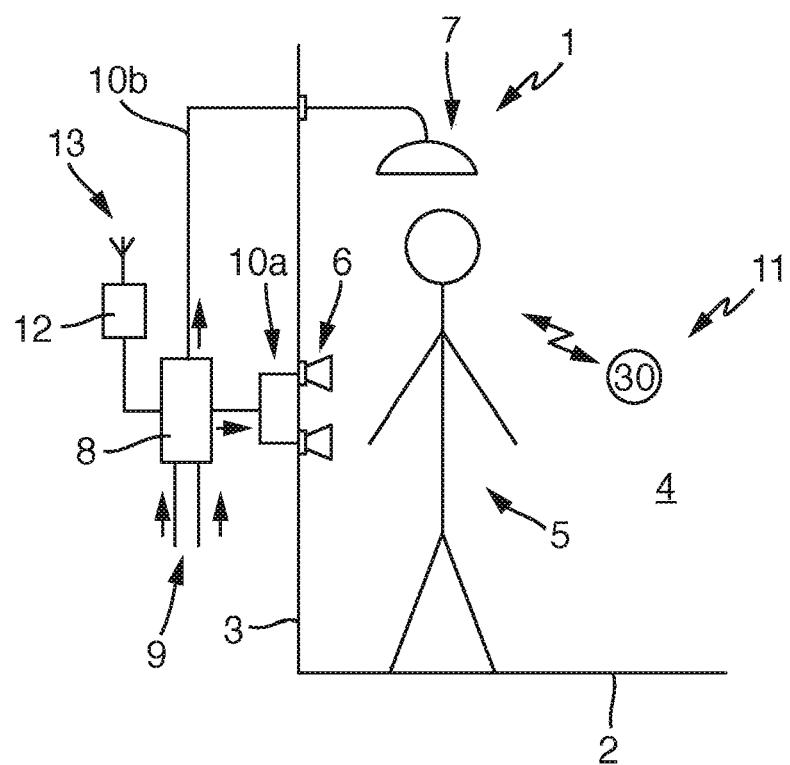
FIG. 1 shows a schematic illustration of an operator control device which is installed in a shower.

In FIG. 1, an intrinsically conventional shower 1 is shown, having a floor 2 and a left-hand wall 3 and a right-hand wall 4. An operator 5 stands in the shower 1 and can use two side sprays 6 and/or a top spray 7 on the left-hand wall 3. Of course, still more sprays or the like could be provided. These sprays are fed by a sanitary fitting 8 which is attached behind or in the wall and which advantageously has a thermostatic function and valve or distribution functions. Two feed lines 9 lead into the sanitary fitting 8, as is usual, one for cold water and one for hot water. From these, feed lines 10*a* lead to the side sprays 6 and 10*b* to the top spray 7.

The operator 5 can operate the sanitary fitting 8 by means of an operator control device 11 according to the invention disposed on the right-hand wall 4, specifically by rotating and/or pressing. The operator control device 11 broadcasts the signals generated by its operation to a controller 12 having an antenna 13. The controller 12 is connected to the sanitary fitting 8 and controls the latter appropriately, advantageously in a manner known per se by means of actuating motors, actuating valves and solenoids or the like. Thus, by means of the operator control device 11, the operator 5 can, for example, distribute the water between side sprays 6 and top spray 7, start or stop a flow of water at all and also adjust the temperature for the water. This is also known per se from the prior art. The operator control device 11 according to the invention is constructed specifically, as will be explained in detail below.

In FIG. 2, a closed operator control device 11 according to the invention is illustrated in an oblique view laterally from the front. It has a partially rotatable operating toggle 15 with an outer circumferential actuating ring 45. The operating toggle 15 can be rotated on this actuating ring 45, for example in order to choose between various menu items, adjustments or functions. Furthermore, the operating toggle 15 also has a front glass 60. An illuminated display can be provided thereon, which can be seen indicated in FIG. 1 as a number "30".

On the rear side of the operator control device 11 is the basic holder 17, which can have been fixed or can be fixed to a wall, for example to the right-hand wall 4 according to FIG. 1. It can be fixed permanently, for example screwed firmly or adhesively bonded. Alternatively, it can be fixed by latching or clipping onto a still further holder, which in turn is firmly connected to the right-hand wall 4. The operating toggle 15 is held on the basic holder.

Figure 4B:
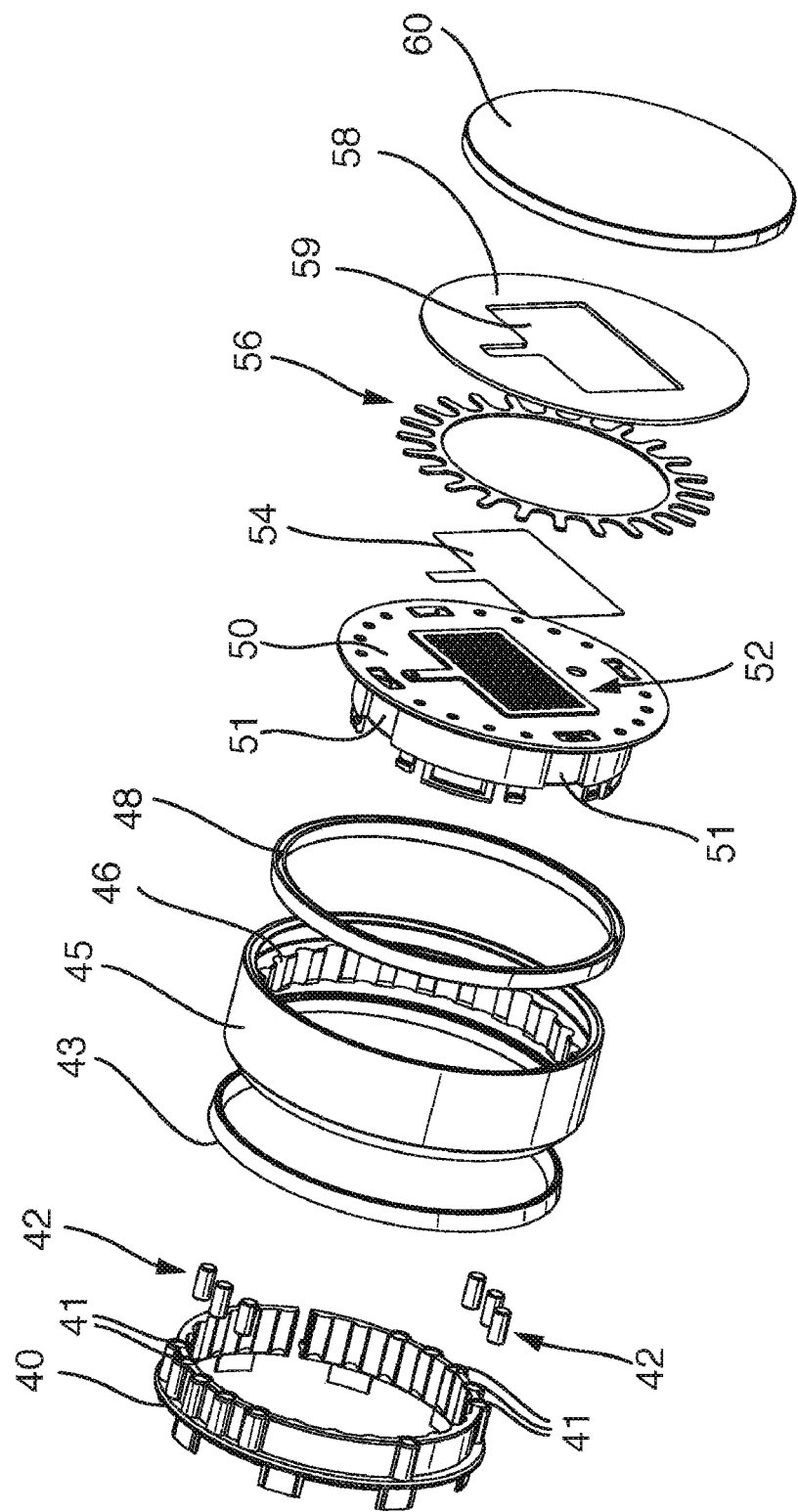

In the entire exploded illustration of FIG. 3, the basic holder 17 can be seen on the left. Reference is also made to the enlarged illustration of FIG. 4*a* and the sectional illustration of FIG. 5. The basic holder 17 is approximately shell-like and has four retaining tongues 18 projecting from a base. Around said retaining tongues there extends a spring ring 22 to be inserted, corresponding to the aforementioned spring, which is advantageously formed as a so-called ondular spring. It advantageously consists of plastic or corrosion-free metal.

As the enlarged illustrations show, an annular deepened magnet holder 19 having a central projecting projection 20 is provided centrally on the base of the basic holder 17. Inserted here is the pusher magnet 24, which is formed as a magnetic ring. It is diametrically magnetized in a plane perpendicular to a rotation axis, illustrated here by the north pole "N" on the left and the south pole "S" on the right. The magnet holder 19 is closed by a lid 26 provided on the inside with a sealing ring 25 when the pusher magnet 24 is inserted. It can be seen from the illustration of FIG. 5 that the pusher magnet 24 has sufficient play about the projection 20 that it can easily rotate. Here, surfaces that are as smooth as possible should advantageously be provided for easy rotatability. Furthermore, the pusher magnet 24 should be able to move only as little as possible or better even not at all in a direction along the rotation axis D illustrated dash-dotted, so it therefore rests virtually on the lid 26.

The operating toggle 15, which in the exploded illustrations begins on the right beside the lid 26, has a lower housing part 29. Provided in the latter is a coil 31 having a coil connection 32, which is provided for inductive charging of a battery pack 36. An 0 ring 34 is provided for sealing, which can also be seen in FIG. 5, since it is located in a recess on the outside of the lower housing part 29.

Mounted on the lower housing part 29 is a circuit board 38 which, amongst other things, has a multiplicity of LEDs 39 on its upper side. These produce the aforementioned illuminated display. A 3-D Hall sensor 62 mentioned at the start is disposed on the underside of the circuit board 38, advantageously on the rotation axis D, and is electrically connected.

Around the lower housing part 29 and also around the retaining tongues 18 there extends a magnet holding ring 40, which has a plurality of differently disposed holding pockets 41. In some of these holding pockets, permanent magnets 42 are disposed as aforementioned magnetic elements, which are rod-like. According to FIG. 5, they are magnetized in a direction parallel to the rotation direction D, which is also respectively drawn in FIG. 5 by way of example.

Figure 5:
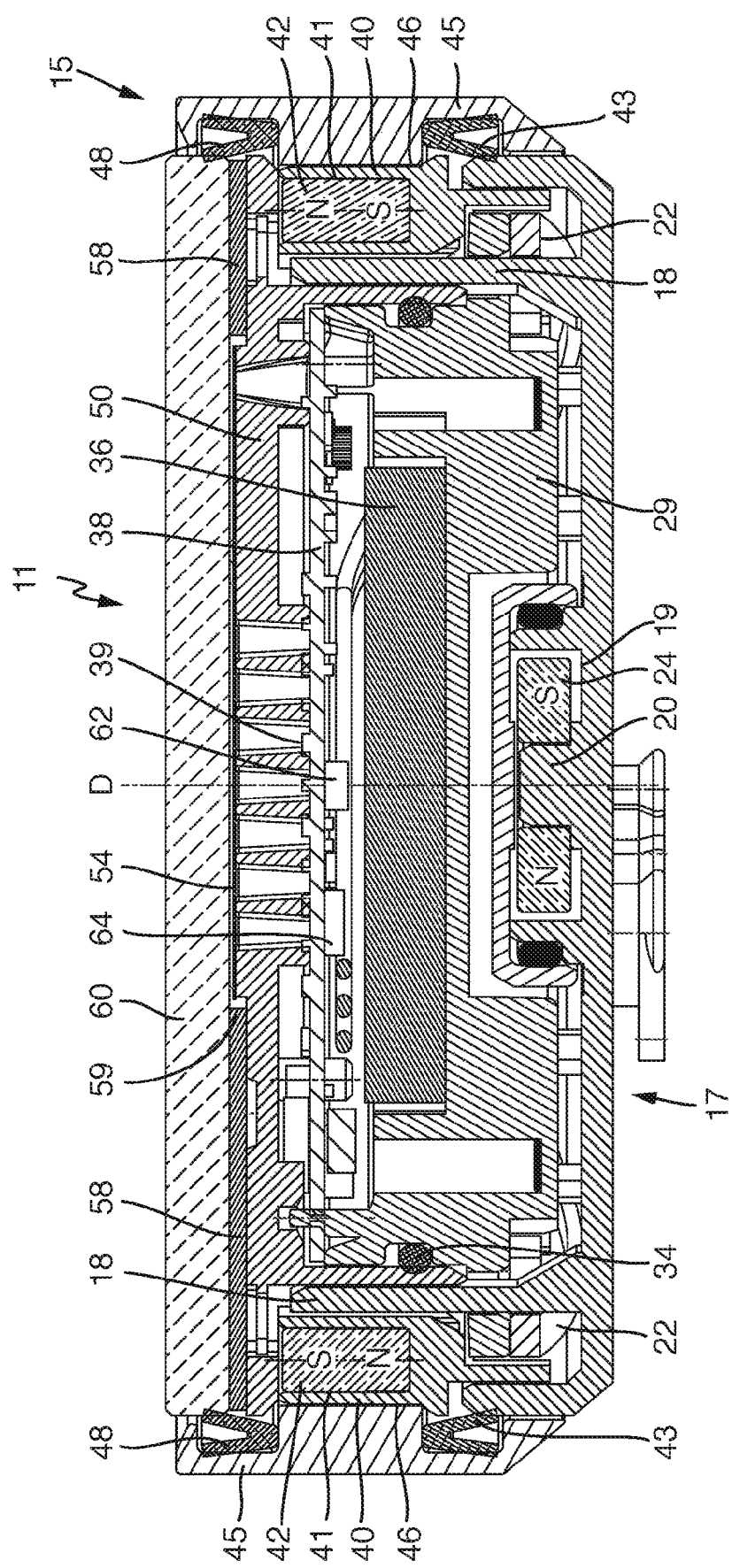
FIG. 5 shows a sectional illustration through the operator control device of FIG. 2.

The actuating ring 45 engaging around on the outside has a lower grooved ring 43 and an upper grooved ring 48, which are formed as elastic rubber seals. They are used for sealing, as FIG. 5 shows. The lower grooved ring 43 seals off the actuating ring 45 downwards against the turned-up circumferential edge of the basic holder 17. The upper grooved ring 48 seals off the actuating ring 45 against the round front glass 60.

Provided inside the actuating ring 45 is an upper housing part 50. Formed on a downwardly projecting flange-like projection from the latter are retaining recesses 51, in which the retaining tongues 18 of the basic holder 17 can engage. As a result, the upper housing part 50 is non-rotationally retained on the basic holder 17 but can be moved in the direction along the rotation axis D and thus also be pushed in, as will be explained in more detail below. Provided on the front on the housing part 50 is a type of opening matrix 52 with numerous openings, which each correspond to one of the LEDs 39. They can, for example, be provided with lenses or other similar optical devices. A diffuser film 54 is placed or bonded in front of the opening matrix 52 for a better optical display.

A star washer 56 rests on the upper housing part 50. Said star washer interacts with the permanent magnets 42 on the magnet holding ring 40, which is non-rotationally held in the actuating ring 45 by means of recesses 46, in such a way that a type of magnetic indexing is achieved. Thus, the rotation of the rotatable operating toggle 15 relative to the inner part, namely said star washer 56, together with an upper housing part 50, lower housing part 29 and basic holder 17, can be indexed with an indexing that can be felt by the operator corresponding to the configuration of the star washer 56. This is also known per se from the prior art. The star washer 56 is held on the front side of the upper housing part 50 by means of a double-sided adhesive pad 58, which is adhesively bonded to the underside of the front glass 60 and thus also ensures sealing towards the front.

The rotating operating part of the operating toggle 15, mentioned at the beginning, is therefore primarily formed by the actuating ring 45 with the magnet holding ring 40 non-rotationally held therein. The fixed operating part mentioned at the beginning is primarily formed by the remaining parts of the operating toggle 15; in particular on account of the engagement of the retaining tongues 18 in the retaining recesses 51, the housing composed of the parts 29 and 50 does not rotate, and thus nor does the illuminated display which is formed by the LEDs 39. Thus, an operator 5 can always easily and accurately detect what is displayed thereon even when rotating the operating toggle 15 during an operation of the operator control device 11.

The entire operating toggle 15 is in turn held and disposed on the basic holder 17, advantageously only removable by means of considerable force or a tool. It can be pushed in relative to the latter, specifically against the force of the spring ring 29. The lower grooved ring 43, which is held on the inner side of the actuating ring 45, is displaced downwards on the basic holder 17. However, it maintains its sealing action, so that no water can enter here. Thus, even the components of the operating toggle 15 which cannot be rotated are also pushed in and pushed towards the basic holder 17. As a result, the 3-D Hall sensor 62 also moves towards the pusher magnet 24. The actuating travel which can be seen in FIG. 5, for example between the underside of the lower housing part 29 underneath the battery pack 36 and the upper side of the lid 26, can in practice be about 0.5 mm to 1 mm, so that it is clearly perceived by an operator. This actuating travel, appearing to be relatively small, can also be detected well by the 3-D Hall sensor 62 as an approach to the pusher magnet 24. Furthermore, the 3-D Hall sensor 62 can also detect a rotation of the permanent magnets 42 about the same with respect to an angle of rotation, so that a rotational actuation of the operating toggle 15 can also be detected. For this purpose, different individual Hall sensors are provided within the 3-D Hall sensor, advantageously one for the detection of the approach to the pusher magnet 24 and one or two further in order to detect different magnetic field lines originating from the permanent magnets 42 during rotation.

Here, it is also obvious why the invention advantageously manages to improve accuracy of detection as a result of the rotatability of the pusher magnet 24. As a result of this rotatability of the pusher magnet 24, the distance to the 3-D Hall sensor 62 does not change, so that the latter also does not detect any signal change or magnetic field intensity change, which it would otherwise detect as an approach to the pusher magnet 24 and thus as pushing-in of the operating toggle in accordance with an operating operation by pressing. The pusher magnet 24 specifically co-rotates as a result of interaction with the permanent magnets 42 with the actuating ring 45, so that here there is intrinsically always the same magnetic field between the magnets 24 and 42. It does not change in the direction parallel to the rotation axis D, so that no approach corresponding to pushing in towards the pusher magnet 24 is detected either. In the plane perpendicular to the rotation axis D through the 3-D Hall sensor 62, the magnetic field of course changes in particular on account of the rotation, so that this can be detected by the 3-D Hall sensor 62 and evaluated. The 3-D Hall sensor 62 is also disposed at the center point of the circular path of the permanent magnets 42, so that the distance is always the same and remains equal.

On the underside of the circuit board 38, on the left beside the 3-D Hall sensor 62, an evaluation device 64 is provided, advantageously an integrated circuit. This evaluates the signals from the 3-D Hall sensor 62 and can thus detect whether the latter has approached the pusher magnet 24 as the operating toggle 15 is pushed in towards the basic holder 17. Likewise, the evaluation device 64 can detect whether the actuating ring 45 with the permanent magnets 42 in the magnet holding ring 40 has been rotated about the non-rotatable 3-D Hall sensor 62. Both movements can be detected accurately by the evaluation device 64 and then sent to the antenna 13 of the controller 12 by means of a transmission device, not illustrated, which is advantageously likewise provided on the circuit board 38. Here, various radio standards can be provided, for example Bluetooth or BLE, Zigbee, Wi-Fi or others.

The wirelessly inductive charging of the battery pack 36 is possible if the operator control device 11 is placed on an appropriate charging station. This is certainly known from mobile phones.

In FIG. 5, the 3-D Hall sensor 62 could also be disposed under the battery pack 36 instead of above it, that is to say between battery pack 36 and lower housing part 29, of course once more lying on the rotation axis D. The battery pack 36 then does not disrupt the magnetic field detection, which improves the accuracy. The 3-D Hall sensor 62 can be disposed on a flexible circuit board or the like and electrically connected, which is guided downwards from the circuit board 38 laterally around the battery pack 36. By means of an accurately fitting depression in the upper side of the lower housing part 29, it can be positioned exactly on the rotation axis D and positioned at a constant distance from the pusher magnet 24.

Although the invention has been described in detailed with reference to preferred embodiments, variations and modifications exist within the spirit and scope of the invention as described and defined in the following claims.

The invention claimed is:

1. An operator control device for a water-conducting sanitary fitting, the operator control device comprising:
    a basic holder fastenable to be fixed in location; and
    an operating toggle disposed on the basic holder, the operating toggle being composed of at least two parts, including at least one rotating operating part and at least one fixed operating part, wherein the rotating operating part and the fixed operating part are rotatable in relation to each other;
    wherein:
    at least the rotating operating part of the operating toggle is rotatable about a rotation axis,
    at least one part of the operating toggle can be pushed in towards the basic holder to a pushed-in position from a normal position along the rotation axis against a spring force of a spring,
    the spring urges the operating toggle with the spring force from the pushed-in position to the normal position,
    at least one pusher magnet is disposed in the basic holder,
    at least one magnetic field sensor is disposed in the part of the operating toggle that can be pushed in, an evaluation device for the magnetic field sensor is provided, which evaluation device is configured to detect whether the magnetic field sensor approaches the pusher magnet during pushing-in of the pushable part of the operating toggle, at least one magnetic element is disposed in the rotating operating part of the operating toggle, the pusher magnet is rotatably mounted for rotation about the rotation axis of the rotating operating part of the operating toggle, and the pusher magnet is operable for interaction with the magnetic element such that the pusher magnet co-rotates upon rotation of the magnetic element together with the rotating operating part of the operating toggle.

2. The operator control device according to claim 1, wherein the pusher magnet has a rotation-symmetric design.

3. The operator control device according to claim 2, wherein the rotation axis extends through a center point and a rotation-symmetry point of the pusher magnet.

4. The operator control device according to claim 1, wherein the pusher magnet, in the direction along the rotation axis, is movable at a maximum of 1 mm or 25% of the movement path of the operating toggle during pushing towards the basic holder.

5. The operator control device according to claim 4, wherein the pusher magnet is not movable in the direction along the rotation axis.

6. The operator control device according to claim 1, wherein the pusher magnet is diametrically magnetized with a north-south direction in a direction perpendicular to the rotation axis.

7. The operator control device according to claim 1, wherein the magnetic element in the rotating operating part is a permanent magnet, with a north-south direction in a direction parallel to the rotation axis.

8. The operator control device according to claim 7, wherein a plurality of magnetic elements are disposed in the operating toggle.

9. The operator control device according to claim 7, wherein the at least one magnetic element in the rotating operating part is disposed in the vicinity of an outer edge of the rotating operating part, preferably along a circle, with the rotation axis passing through the center point thereof.

10. The operator control device according to claim 1, wherein the spring extends in a ring shape, preferably with a center point on the rotation axis.

11. The operator control device according to claim 10, wherein the spring is an ondular washer composed of two mirror-symmetrically ondulated rings made of spring-elastic material with a mirror plane perpendicular to the rotation axis.

12. The operator control device according to claim 1, wherein the pusher magnet is disposed in a recess corresponding to its shape and/or is disposed sitting on a projection of the basic holder.

13. The operator control device according to claim 12, wherein a water-tight cover holds the pusher magnet and covers it in a water-tight manner towards the outside.

14. The operator control device according to claim 1, wherein the magnetic field sensor is disposed in the fixed operating part and non-rotatably retained by the basic holder.

15. The operator control device according to claim 14, wherein the operating toggle is composed of two parts, with the fixed operating part as an interior part which is non-rotatably retained by the basic holder, wherein the rotating operating part which is rotatable in relation to the fixed operating part is provided as an actuation ring around the fixed operating part, the outer edge of said actuation ring forming an outer edge of the operating toggle.

16. The operator control device according to claim 14, wherein the at least one magnetic element is retained in or on the rotating operating part.

17. The operator control device according to claim 1, wherein the operating toggle includes only the rotatable rotating operating part and the fixed operating part, wherein the entire operating toggle can be pushed in.

18. The operator control device according to claim 1, wherein the fixed operating part includes a display.

19. The operator control device according to claim 1, wherein the magnetic field sensor is an assembly unit having further magnetic field sensors for detecting a rotation of the rotating operating part relative to the basic holder.

20. The operator control device according to claim 19, wherein the magnetic field sensor is a 3D magnetic field sensor or a 3D Hall-effect sensor.

21. The operator control device according to claim 1, wherein in the operating toggle a signal evaluation for the magnetic field sensor is provided.

22. The operator control device according to claim 21, wherein the signal evaluation has a transmission device for wireless sending or transmitting of data on the rotated and/or pushed position of the operating toggle relative to the basic holder to a control unit for controlling the water-conducting sanitary fitting.

23. The operator control device according to claim 1, wherein the operating toggle has a distinct energy supply.

24. The operator control device according to claim 23, wherein the distinct energy supply is a battery pack disposed in the fixed operating part.

* * * * *